(12) United States Patent
Brugman

(10) Patent No.: US 11,094,841 B2
(45) Date of Patent: Aug. 17, 2021

(54) SOLAR CELL

(71) Applicant: ASVB NT Solar Energy B.V., Deventer (NL)

(72) Inventor: Adrianus Brugman, Eefde (NL)

(73) Assignee: ASVB NT Solar Energy B.V., Deventer (NL)

( * ) Notice: Subject to any disclaimer, the term of this patent is extended or adjusted under 35 U.S.C. 154(b) by 0 days.

(21) Appl. No.: 16/489,871

(22) PCT Filed: Feb. 2, 2018

(86) PCT No.: PCT/EP2018/052650
§ 371 (c)(1),
(2) Date: Aug. 29, 2019

(87) PCT Pub. No.: WO2018/158036
PCT Pub. Date: Sep. 7, 2018

(65) Prior Publication Data
US 2019/0393372 A1    Dec. 26, 2019

(30) Foreign Application Priority Data

Mar. 1, 2017  (EP) .................................... 17158784

(51) Int. Cl.
*H01L 31/054* (2014.01)
*H02S 40/22* (2014.01)
(Continued)

(52) U.S. Cl.
CPC ........ *H01L 31/0547* (2014.12); *H01L 31/048* (2013.01); *H01L 31/0543* (2014.12);
(Continued)

(58) Field of Classification Search
CPC ............... H01L 31/048; H01L 31/0547; H01L 31/02325; H01L 31/0232; H01L 31/02366;
(Continued)

(56) References Cited

U.S. PATENT DOCUMENTS 9,741,887 B2   8/2017 Woo et al.
2008/0041434 A1*  2/2008 Adriani ............. H01L 31/02013
136/244
(Continued)

FOREIGN PATENT DOCUMENTS

DE    202009007771 U1   8/2009
DE    102013001363 A1   7/2014
EP       2897179 A2     7/2015

*Primary Examiner* — Lindsey A Bernier
(74) *Attorney, Agent, or Firm* — The Webb Law Firm

(57) ABSTRACT

The invention relates to a solar cell including a first layer having a checkered layout of fields having a photovoltaic layer and fields having at least a reflective layer; a second layer arranged above and spaced apart from the first layer, which second layer has a checkered layout of fields having a photovoltaic layer and of openings, with the openings of the second layer registered with the fields having a photovoltaic layer of the first layer; a burning glass layer arranged above and spaced apart from the second layer, with the fields having a photovoltaic layer of both the first and second layer as well as the fields having at least a reflective layer facing the burning glass layer; and a third layer arranged between the first and second layer, preferably arranged to the second layer, which third layer has a checkered layout of fields having a photovoltaic layer and of openings, with the openings of the third layer registered with the openings of the second layer and with the fields having a photovoltaic layer of the third layer facing the first layer.

8 Claims, 1 Drawing Sheet

(51) Int. Cl.
 *H01L 31/048* (2014.01)
 *H02S 40/42* (2014.01)
 *H02S 40/44* (2014.01)

(52) U.S. Cl.
 CPC .............. *H02S 40/22* (2014.12); *H02S 40/42* (2014.12); *H02S 40/425* (2014.12); *H02S 40/44* (2014.12)

(58) Field of Classification Search
 CPC ..... H01L 31/0543; H02S 40/22; H02S 40/42; H02S 40/425; H02S 40/44
 See application file for complete search history.

(56) References Cited

U.S. PATENT DOCUMENTS

2011/0030762 A1 2/2011 Kim
2015/0325734 A1* 11/2015 Pisharodi ................ H01L 31/05
 136/246

* cited by examiner

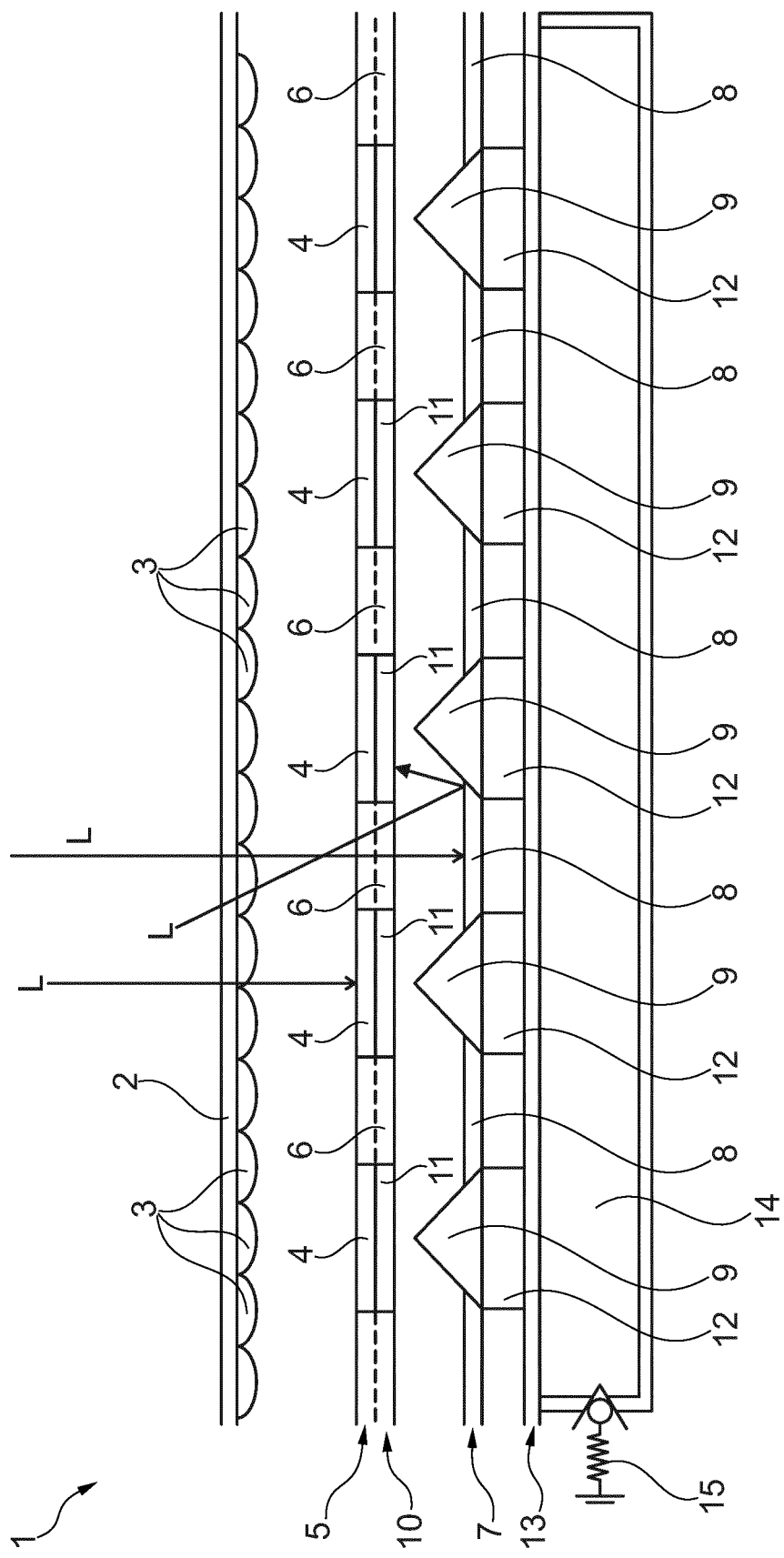

SOLAR CELL

CROSS REFERENCE TO RELATED APPLICATIONS

This application is the United States national phase of International Application No. PCT/EP2018/052650 filed Feb. 2, 2018, and claims priority to European Patent Application No. 17158784.3 filed Mar. 1, 2017, the disclosures of which are hereby incorporated by reference in their entirety.

BACKRGOUND OF THE INVENTION

Field of the Invention

The invention relates to a solar cell.

Description of Related Art

Solar cells convert light, such as sunlight, into electrical energy. This conversion of light into electricity is achieved by a photovoltaic material. Photovoltaic material is a semiconductor material exhibiting the photovoltaic effect. When light is absorbed by such photovoltaic material, electrons in the semiconductor material will be excited causing a higher energy level, which results in an electric potential, which can be used to power an electrical appliance.

The efficiency of known solar cells is still to be desired. High performance solar cells still have an efficiency of only 40%. As a result the number of solar cells need to be increased to compensate for such low efficiency, which results in for example roofs of houses being fully covered by solar panels each containing a number of solar cells, only to harvest a reasonable amount of solar power.

Accordingly, it is an object of the invention to provide solar cells with a further improved efficiency.

SUMMARY OF THE INVENTION

This object is achieved according to the applicant with a solar cell comprising:
- a first layer having a checkered layout of fields having a photovoltaic layer and fields having at least a reflective layer;
- a second layer arranged above and spaced apart from the first layer, which second layer has a checkered layout of fields having a photovoltaic layer and of openings, wherein the openings of the second layer are registered with the fields having a photovoltaic layer of the first layer;
- a burning glass layer arranged above and spaced apart from the second layer, wherein the fields having a photovoltaic layer of both the first and second layer as well as the fields having at least a reflective layer are facing the burning glass layer; and
- a third layer arranged between the first and second layer, preferably arranged to the second layer, which third layer has a checkered layout of fields having a photovoltaic layer and of openings, wherein the openings of the third layer are registered with the openings of the second layer and wherein the fields having a photovoltaic layer of the third layer face the first layer.

The burning glass layer concentrates the light incident on the solar cell and directs the light towards the first and second layer. Part of the light will be absorbed by the photovoltaic layer of the second layer and part of the light will be absorbed by the photovoltaic layer due to the checkered layout of the second layer with fields of photovoltaic material and openings through which part of the light can arrive at the first layer.

Part of the light, which is incident under an angle will be reflected by the fields having at least a reflective layer and will directed onto the photovoltaic layer of the third layer. As a result a higher efficiency is obtained as also reflected light is converted into electricity.

In a preferred embodiment of the solar cell according to the invention the fields having at least a reflective layer of the first layer have a diamond or pyramid shaped relief. The diamond or pyramid shaped relief ensures that light incident on the solar panel at an angle is correctly reflected towards the third layer.

In a further preferred embodiment of the solar cell according to the invention the diamond or pyramid shaped relief is lined with pre-stretched graphene and a layer of piezoelectric material is arranged on the first layer on the opposite side of the relief.

According to the applicant, pre-stretched graphene, when subjected to heat, will cause vibrations. The heat will be generated by the light entering the solar cell and being absorbed by the photovoltaic material. This absorbed light will generate partially an electric current and for the remaining part heat.

The thus generated heat will be at least partially be used to have the pre-stretched graphene generate vibrations, which vibrations are converted by the layer of piezoelectric also into an electric current, which is combined with the electrical current of the photovoltaic layers, further increasing the efficiency of the solar cell.

Yet another embodiment further comprises a fourth layer of pyro-electric material arranged in heat conducting contact with at least the first layer and an air chamber arranged along the pyro-electric material, which air chamber is provided with an pressure relief valve.

With the pyro-electric material any heat generated by the light in the solar cell and not converted otherwise can be used to generate an electric potential over the the pyro-electric material. In order to generate a current with the pyro-electric material, the temperature must fluctuate. According to the applicant, this temperature fluctuation is achieved by the air chamber arranged along the pyro-electrical material. The air is also heated and by the pressure relief valve, the air is let out of the chamber, when the air is heated too much and accordingly the pressure is risen too high. When the pressure relief valve opens, the pressure drops and accordingly, the temperature also drops. Due to such pressure drops a fluctuation in temperature of the pyro-electric material is obtained and an electric current is generated.

The invention also relates to a solar panel comprising a number of solar cells according to the invention, wherein the solar cells are arranged electrically in series.

BRIEF DESCRIPTIONS OF THE DRAWINGS

These and other features of the invention will be elucidated in conjunction with the accompanying drawings.

FIG. 1 shows a schematic view of an embodiment of a solar cell according to the invention.

DESCRIPTION OF THE INVENTION

In FIG. 1 the solar cell 1 has a burning glass layer 2 with a number of sphere shaped parts 3, which direct the light L into the solar cell 1.

Part of the light L is incident on fields 4 having a photovoltaic layer of the second layer 5. This second layer 5 has a checkered layout of fields 4 and openings 6, through which light L can be incident on the first layer 7.

The first layer 7 has a checkered layout of fields with a photovoltaic layer 8 and fields 9 with a pyramid relief and at least a reflective layer, such that light L incident on the solar cell 1 under an angle is reflected to the third layer 10, which is provided with fields 11 of photovoltaic material.

The fields 9 with pyramid relief are also lined with pre-stretched graphene which will generate vibrations due to heating of the light L incident on and reflected by the pyramid shaped fields 9.

The vibrations caused by the graphene are transmitted to a layer of piezoelectric material 12, which converts the vibrations to an electric current.

Furthermore, a layer 13 of pyro-electric material is provided in heat conducting contact with the first layer 7, such that the pyro-electric material can be heated and a electric potential can be generated over the pyro-electric material.

In order to subject the pyro-electric material to temperature changes, which enables the pyro-electric material to generate an electric current, an air chamber 14 is provided in direct contact with the layer 13. The air chamber 14 has a pressure relief valve 15, such that pressure in the air chamber 14 can be reduced, when the air is heated too much. By relieving the pressure, the temperature will also drop in the chamber 14, allowing for the pyro-electric material to produce an electric current.

The invention claimed is:

1. A solar cell comprising:
    a first layer having alternating fields including a photovoltaic layer and fields having at least a reflective layer;
    a second layer arranged above and spaced apart from the first layer, wherein the second layer has alternating fields including a photovoltaic layer and fields of openings, wherein the openings of the second layer are aligned with the fields having a photovoltaic layer of the first layer;
    a glass layer arranged above and spaced apart from the second layer, wherein the fields having a photovoltaic layer of both the first and second layer as well as the fields having at least a reflective layer are facing the glass layer; and
    a third layer arranged between the first and second layerS, wherein the third layer has alternating fields including a photovoltaic layer and fields of openings, wherein the openings of the third layer are aligned with the openings of the second layer and wherein the fields having a photovoltaic layer of the third layer face the first layer, wherein the fields having at least a reflective layer of the first layer have a diamond or pyramid shaped texture, wherein the diamond or pyramid shaped texture is lined with pre-stretched graphene and wherein a layer of piezo-electric material is arranged on the first layer on the opposite side of the texture from the pre-stretched graphene.

2. The solar cell according to claim 1, further comprising a fourth layer of pyro-electric material arranged in heat conducting contact with at least the first layer and an air chamber arranged along the pyro-electric material, wherein the air chamber is provided with a pressure relief valve.

3. A solar panel comprising a number of solar cells according to claim 1, wherein the solar cells are arranged electrically in series.

4. A solar panel comprising a number of solar cells according to claim 2, wherein the solar cells are arranged electrically in series.

5. A solar cell comprising:
    a first layer having alternating fields including a photovoltaic layer and fields having at least a reflective layer;
    a second layer arranged above and spaced apart from the first layer, wherein the second layer has alternating fields including a photovoltaic layer and fields of openings, wherein the openings of the second layer are aligned with the fields having a photovoltaic layer of the first layer;
    a glass layer arranged above and spaced apart from the second layer, wherein the fields having a photovoltaic layer of both the first and second layer as well as the fields having at least a reflective layer are facing the glass layer; and
    a third layer arranged between the first and second layers, wherein the third layer has alternating fields including a photovoltaic layer and fields of openings, wherein the openings of the third layer are aligned with the openings of the second layer and wherein the fields having a photovoltaic layer of the third layer face the first layer; and
    a fourth layer of pyro-electric material arranged in heat conducting contact with at least the first layer and an air chamber arranged along the pyro-electric material, wherein the air chamber is provided with a pressure relief valve.

6. A solar panel comprising a number of solar cells according to claim 5, wherein the solar cells are arranged electrically in series.

7. The solar cell according to claim 5, wherein the fields having at least a reflective layer of the first layer have a diamond or pyramid shaped texture.

8. The solar cell according to claim 7, wherein the diamond or pyramid shaped texture is lined with pre-stretched graphene and wherein a layer of piezo-electric material is arranged on the first layer on the opposite side of the texture from the pre-stretched graphene.

* * * * *